Dec. 19, 1961 C. S. ROBERTS 3,013,955

METHOD OF TRANSISTOR MANUFACTURE

Filed April 29, 1959

INVENTOR.
C. SHELDON ROBERTS
BY
Lippincott & Ralls
ATTORNEYS

United States Patent Office 3,013,955

Patented Dec. 19, 1961

3,013,955
METHOD OF TRANSISTOR MANUFACTURE

Cornelius Sheldon Roberts, Los Altos, Calif., assignor, by mesne assignments, to Fairchild Camera and Instrument Corporation, Long Island, N.Y., a corporation of Delaware Filed Apr. 29, 1959, Ser. No. 809,691
9 Claims. (Cl. 204—15)

The present invention relates to an improvement in the manufacture of transistors and more particularly to an improved method of forming ohmic transistor contacts having minimized spreading resistance.

In the design and manufacture of transistors adapted for high frequency application, it is of prime importance that very small spacing be attained between the transistor junctions and the theory underlying this requirement is well known in the art. One particular type of transistor which is highly desirable for high frequency application is the double-diffused silicon transistor. This type of transistor includes a wafer having a base material diffused thereon and an emitter material diffused upon the base material. The resultant transistor configuration includes a transistor surface formed in part of an emitter and a base material separated only by the emitter-base junction. Extremely small emitter dimensions are attained in the above-described transistor, and for example, the emitter dimension on the transistor surface may be no greater than a few millimeters. It is with respect to this type of transistor that the present invention is directed as an improvement in the manufacturing techniques thereof. The following description is consequently referenced to the manufacture of double-diffused silicon transistors.

The utilization of transistors in electrical circuitry requires the provision of electrical contacts to separate transistor portions, so that the transistor comprises a substantially conventional circuit element having contacts extending therefrom for connection in circuit with other circuit elements. In the joinder of electrical leads to the N and P-type semiconducting materials of a transistor it is required that ohmic contact be achieved. The term "ohmic contact" is herein employed not only to include the connotation of a contact at which no rectification or other non-linear behavior occurs, but more broadly as a contact which serves purely as a means of getting current into or out of the semiconductor, but plays no part in the active process occurring in the device.

Despite the major advances in transistor technology accomplished in recent years, there yet remains major difficulty in reducing resistances associated with transistor structure and contacts thereto. Particularly is this difficulty encountered in those transistors designed for high frequency application for although extremely small dimensions of the semiconductor material are employed to reduced bulk resistance physical limitations on contact attachment arise. Although the double-diffused silicon transistor here under consideration is in actuality a junction type transistor, yet the dimensions of the semiconducting materials thereof are so small that certain conditions of point contact transistors are in effect approached. Thus, in addition to employing the usual relationship for determining the residual resistance of the semiconductor, it is equally important to consider the limiting resistance of the bulk material for a point contact transistor, such resistance normally being termed the "spreading resistance" because of the appearance of the current flow lines in this type of transistor. The ohmic value of the spreading resistance for point contact transistors is known to be inversely proportional to the diameter of the point contact with the semiconducting material and this is equally applicable to minute junction type transistors. It thus follows that in order to minimize the spreading resistance, it is necessary to maximize the area of the point contact.

Employing this consideration to the present instance, it will then be seen that the surface of both the emitter and base of a double-diffused silicon transistor should be substantially covered by the conducting leads therefrom in order to minimize the spreading resistance of the transistor. It will be apparent that it is necessary to minimize the spreading resistance in both the base and emitter in order to take advantage of the small geometry of the transistor materials for high frequency application. The difficulty encountered in this respect lies in the magnitude of the emitter and base dimensions. Present-day masking techniques employed in the manufacture of transistors of the type herein under consideration allow the production of transistors having an emitter dimension of the order of a few millimeters and in such instances it is desirable that the base and emitter contact material approach the emitter junction to within a fraction of a millimeter. Very substantial difficulties are encountered in attempting to accomplish this result with mechanical masking methods.

The present invention provides a method of manufacture wherein the above-noted requirements for contact placement and extent upon an emitter and a base of a transistor is accomplished without the use of mechanical masking methods. It is herein contemplated that ohmic contacts shall be made to semiconducting materials of a transistor in such a manner that the emitter junction itself prevents the placement of the contact metal thereupon. More particularly, the present invention makes use of electrical fields at the emitter junction to limit the extent of the deposition of metal upon both emitter and base material. It is an object of the present invention to provide a method of minimizing the spreading resistance of ohmic contacts on a transistor.

It is another object of the present invention to provide an improved method of separately plating N-type and P-type semiconducting materials of a transistor to within extremely close separation of a juncture therebetween without electrically shorting such juncture.

It is a further object of the present invention to provide as an improvement in a method of manufacturing double-diffused silicon transistors, a manner of separately plating different semiconducting materials to within very close spacing of a juncture therebetween by employing an electrical field at the junction to limit the extent of the plating.

It is still another object of the present invention to provide a method of gold-plating adjacent emitter and base surfaces of a double-diffused silicon transistor to within extremely close separation from the junction therebetween without the use of mechanical masking techniques to the end of minimizing the spreading resistance of ohmic contacts made to said base and emitter.

Various other possible objects and advantages of the present invention will become apparent to those skilled in the art, from the following description of a preferred manner of accomplishing the method of manufacture of this invention. Although the method hereinafter described is referenced to but a single preferred embodiment of the invention, no limitation is intended thereby, reference being made to the appended claims for a proper definition of the true scope of the present invention.

The present invention, in brief, relates to a method of applying ohmic contacts to semiconducting silicon material. The invention is particularly adapted for utilization with a double-diffused silicon transistor, wherein an extremely minute emitter of N-type silicon is surrounded by a very thin layer of P-type silicon material upon a thin wafer of N-type silicon material. Although the present invention may be adapted to P-N-P-type junction transistors with only minor modification, the following description is referenced to but the N-P-N-type transistor for clarity.

The steps of the method of the invention are illustrated in the accompanying drawing, wherein.

The present invention provides a preferential plating of gold upon the surface of an N-type semiconductor material which may be the transistor emitter by the establishment of a photovoltage across the emitter junction which makes the N side of the junction cathodic. Following this initial plating of the emitter, the P-type material which forms the base in the present example, is electroplated with gold to within a very close spacing from the juncture by the establishment of electric fields in the transistor which limit the plating extent. Following the deposition of gold plating upon the emitter and base elements of the transistor as described above, the gold may be alloyed with the silicon in a conventional manner and at such time a gold wire may be attached to the transistor element to thereby form electrical contacts extending therefrom and substantially encompassing the exposed element surfaces. In this manner the spreading resistance of the transistor elements is minimized in that the contact area is maximized.

Figures 1, 2:
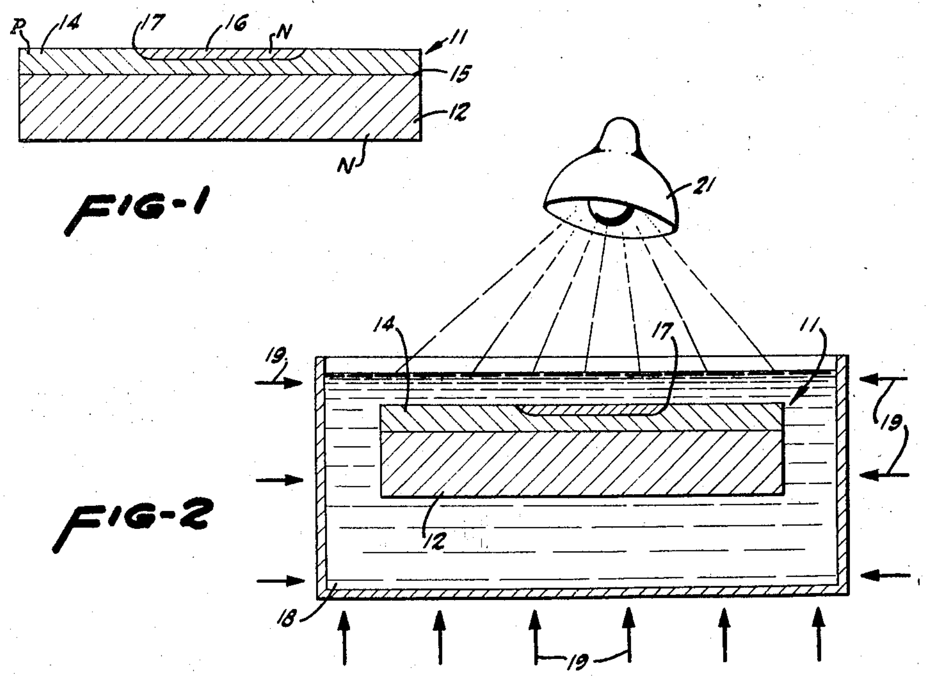
FIG. 1 is a sectional view of a transistor before application of ohmic contacts.
FIG. 2 is a sectional view illustrating the step of chem-plating the emitter.

Considering now the present invention in some detail and referring to FIG. 1 of the drawing, there will be seen to be illustrated therein a portion of a double-diffused silicon transistor 11 including a thin wafer 12 formed in a conventional manner of a portion of N-type silicon crystal. The wafer 12 forms the collector element of the transistor. In accordance with conventional transistor fabrication practice, there is formed upon the upper surface of the layer 12, a layer of P-type silicon which is diffused therein, under controlled conditions to a known and predetermined depth to form thereby a base element 14, separated from the collector 12 by a base-collector junction 15. Upon the top of the base element 14 there is formed a dot of N-type silicon which is diffused into the base layer in conventional manner to form an emitter element 16 separated from the base by a base-emitter juncture 17. The lateral extent of diffusion of the emitter in the base is limited by oxide masking techniques, well known in the art. In the transistor under consideration the lateral dimensions of the emitter 16 are generally of the order of a few millimeters and the thickness of the emitter and base layers of the transistor are of a lesser dimension. Conventional techniques are available for the manufacture of a double-diffused silicon transistor of the type described and the reference is herein made to the literature for a more complete description thereof.

The process of this invention may be employed with a single transistor or with a multiplicity of transistors formed upon a single wafer of semiconducting material. In order to facilitate an understanding of the invention, the following description is referenced to a single transistor structure.

Figure 3:
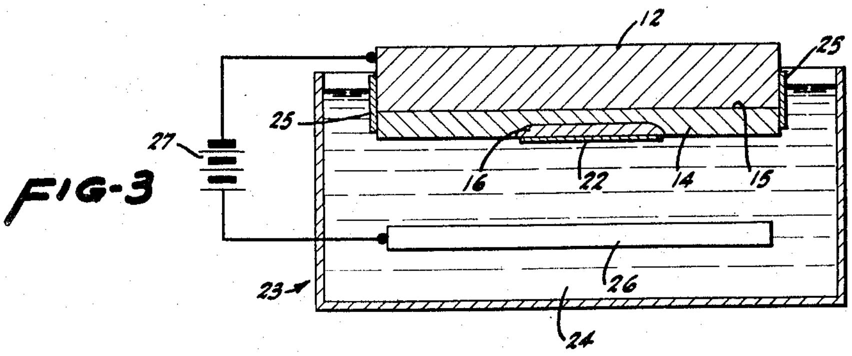
FIG. 3 is a sectional view illustrating the step of electroplating the base.

In order to provide ohmic electric contacts to the base and emitter elements of the above-described transistor with a minimum spreading resistance it is necessary to provide the electrical contact between each of the semiconducting layers and the conducting portion of the contacts over a maximum area of the emitter and base areas. This is herein accomplished by separate steps as illustrated in FIGS. 2 and 3 of the drawing. In order to provide an electrical conductor in intimate contact with the emitter 16 over substantially the entire exposed surface thereof it is herein contemplated that a conducting material such as gold shall be plated upon the emitter surface. This plating, in order to approach a junction 17 between the base and emitter surfaces within a fraction of a millimeter, cannot be satisfactorily mechanically or physically limited in extent. The minute dimensions involved preclude the use of conventional masking techniques normally employed in this respect. Plating of the exposed surface of the emitter 16, above noted to be formed of N-type silicon, is herein accomplished by a displacement reaction. This reaction is carried out by placing the transistor in a basic solution of potassium gold cyanide. It has been determined that silicon in such a solution will produce the following reaction:

$$2KAu(CN)_2+4KOH+Si \rightarrow 2Au+K_2SiO_3+4KCN+H_2+H_2O$$

and furthermore, that the rapidity of this reaction is increased by the application of heat. In order to plate only the N-type material forming the emitter of the transistor hereof, there is herein established a photovoltaic effect. This effect is produced by the application of energy to the emitter and base surfaces in the form of photons of light. These photons form hole-carrier pairs in the N- and P-type silicon and inasmuch as the junction 17 between the emitter and base is known to operate as a collector for minority carriers in the semiconductor material, it then follows that the built-in electric field of the juncture operates to cause a transfer of minority carriers across the transistor region whereby a photovoltage is created on the surface adjacent the junction. The N-type region forming the emitter 16 thus becomes relatively negative or cathodic so that positive Au ions from the $Au(CN)_2^-$ complex are attracted to the more negative region and consequently first deposit upon the N-side of the junction. It will be appreciated that by the establishment of the above-noted photovoltaic effect, a preferential plating occurs in that Au ions are initially and preferentially attracted to and deposited upon the N-type material which is maintained at a relatively negative potential as regards the only other exposed surface of the transistor, namely, the surface of the P-type base 14.

Carrying out of the above-noted preferential gold plating upon the N-type silicon forming the emitter of the transistor is accomplished as illustrated in FIG. 2 wherein the transistor 12 is immersed, at least insofar as the emitter and base portions thereof are concerned, in a bath 18 of potassium gold cyanide maintained as a basic solution. Heat is applied to the solution, as is illustrated by the arrows 19, as for example by conventional heating means such as a hot-plate or the like, and intense light is provided from such as a microscope lamp 21 directed upon the transistor surface to be plated. It will be appreciated that the application of heat and light may be accomplished in a variety of ways, such as for example, by the utilization of an infra-red lamp of substantial power output. Although the displacement reaction noted above operates to preferentially deposit gold upon the cathodic N material of the emitter, it will be appreciated that continued maintenance of the reaction conditions will eventually cause gold to be deposited upon the P-type material. The amount of time required to deposit a desired layer of gold upon the N-type material, and before the deposition of gold upon the P-type material occurs, is dependent in great part upon the number of carriers present in these materials. Inasmuch as semiconductor materials vary widely in the impurity concentrations therein, it is not possible to accurately identify the exact time that the above-noted displacement reaction should be continued, but it is instead necessary through a proper consideration of the semiconductor material involved to arrive at an appropriate time limit for each type of semiconductor. It is herein noted, however, that for semiconducting silicon having a relatively large number of carriers therein, suitable plating upon the N-type emitter is accomplished in a time range between about 1.0 and 10 minutes.

The intensity of light focused upon the transistor surface will further influence the amount of time required inasmuch as the hole-carrier pair production is dependent upon the number of photons incident upon the transistor surface. As regards the requisite temperature of the solution for satisfactory plating, it has been found that a temperature range of 30–70 degrees C. is quite satisfactory, although variations are possible therein. A limitation upon the temperatures involved is found in that should the temperature be lowered sufficiently, as for example to about 5 degrees, a precipitation of potassium hydroxide upon the transistor surface hampers the plating operation. It has been found in carrying out the above-described step of preferentially plating N-type silicon of a transistor that gold is not deposited upon the base emitter junction, so that this junction is not electrically shorted and consequently the resultant transistor is in no way damaged by the deposition of the conducting gold layer or film 22 upon the emitter surface.

Following the chemical plating of the N-type silicon of the transistor 12, as described above, there is then accomplished the further step in the method of this invention of preferentially plating the P-type silicon material so as to thereby provide an electrically conducting layer thereon to which an external contact may be joined for again minimizing the spreading resistance of the contacts.

Reference is made in this respect to FIG. 3 of the drawing wherein there is illustrated a conventional electroplating cell 23. This electroplating cell 23 includes a conventional gold cyanide plating bath 24 with a gold anode 26 disposed therein. In this electroplating step of the process it is desired to establish a current flow through the bath 24 from the anode 26 to the P-type base layer of the transistor. In order to prevent shorting of the current directly to the collector 12, there is provided a noncritically positioned insulating layer or mask 25 about the peripheral edge of the transistor, or multiplicity of transistors, covering the collector edge and juncture 15, and formed for example of wax. The transistor 11 is immersed, at least in part, in the gold cyanide bath of the electroplating cell and there is applied an electrical potential between the gold anode 26 and the transistor wafer 12. Inasmuch as it is herein desired to deposit a layer of gold upon a P-type material forming the base 14 of the transistor, it is possible to provide electrical connection between the gold anode 26 through a power supply illustrated as a battery 27, directly to the back of the wafer 12. In this manner there is provided an electrical circuit which may be traced from the gold anode through the solution and thence through the P-type base and N-type collector across the junction 15 therebetween and back through the battery 27 to the anode. It will be appreciated that the foregoing path is that of an electrical current, i.e., the direction of travel of positive charges and inasmuch as it is positively charged gold ions that are to be plated upon the transistor, it will be apparent that such ions form the current through the solution and consequently alight upon the exposed surface of the base 14 to be deposited thereon and form a plating film 28 upon such surface. It is necessary in this instance to take care that the potential applied is not sufficient to break down the junction between the base and collector of the transistor. However, inasmuch as this juncture is biased in a forward direction, it will be appreciated that current flow therethrough is readily accomplished and that the connection of the negative terminal of the battery 27 to the wafer 12 is substantially the same as applying this potential to the P-type material to be plated, for a low resistant electrical path is provided through the transistor junction 15 and collector 12 to same.

It will be appreciated that the P-type silicon of the transistor base is maintained at a relatively negative potential with regard to the N-type emitter 16, so that consequently in the electroplating step previously described, gold is preferentially plated only upon the P-type base material. The actual plating techniques employed in the electroplating step of this invention are quite conventional insofar as the gold cyanide bath and gold anode are concerned, and furthermore insofar as the electrical potential is concerned, except for the limitation upon the maximum potential that may be employed inasmuch as it is necessary to limit same to a value less than that which would break down the transistor junction between the base and collector. It has been clearly established by experimentation and manufacture of transistors in the foregoing manner that the electroplating step of this invention does not deposit gold upon the juncture itself, but instead operates to relatively uniformly deposit a layer of gold upon the P-type material to within some small fraction of a millimeter from the emitter-base juncture.

Figure 4:
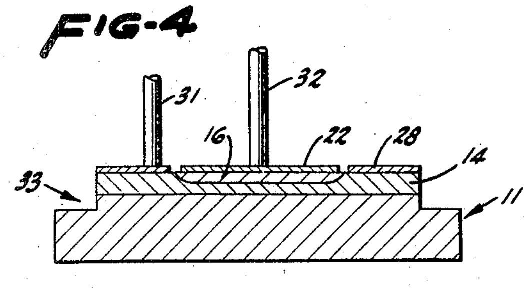
FIG. 4 is a sectional view of the transistor with contacts and leads attached.

In accordance with the foregoing steps, there will be seen to be produced a transistor having a relatively uniform layer 22 of gold deposited over substantially the entire surface of the emitter 16 and likewise a relatively uniform layer 28 of gold deposited substantially entirely over the surface of the base 14. The collector junction of the individual transistor, or of the individual transistors from a multiplicity of transistors produced upon one wafer, may be cleaned of any harmful residual material by the procedure of chemically etching a mesa 33 about the transistor, as is well known in the art. This is illustrated in FIG. 4 of the drawing, wherein it may be noted that no actual contact exists between the two layers of gold 22 and 28, but that in fact there is a clear line of demarcation between same, so that no electrical shorting of the emitter-base juncture results.

Inasmuch as it is conventional to alloy ohmic contacts to semiconducting material such may herein be accomplished in a conventional manner by raising the temperature of the transistor or at least of the contacting surface of the gold layer and semiconducting materials to a temperature above the gold-silicon eutectic temperature of 373 degrees C. Again, it is noted that this latter step may be accomplished in a conventional manner well known in the art, and furthermore that a pair of gold wires 31 and 32 may at this or later times be joined to the conducting layers 28 and 22 separately in a known manner. Joinder of the wires 32 and 31 to the layers 22 and 28 respectively at the time of alloying the latter to the emitter and base elements of the transistor minimizes the discontinuity introduced by attachment of the wires.

In accordance with the above-described steps of the present invention it will be seen to be possible to provide conducting layers or films substantially coextensive with the exposed surfaces of both emitter and base elements of a double-diffused silicon transistor of relatively minute dimensions. As a consequence of this advancement in forming ohmic contacts to the transistor of this type, a material advancement is afforded. It will be appreciated that by the reduction of spreading resistance attained through the use of the present invention, the high frequency applicability of this type of transistor is materially enhanced.

As previously noted, the above-described method may be applied also to P-N-P type transistors with suitable modification, as will be apparent to those skilled in the art.

What is claimed is:

1. A method of manufacturing a semiconductor device comprising the steps of diffusing selected impurities into semiconducting material to form layers of zones of opposite type semiconducting material separated by rectifying junctions, at least two of said zones extending to one face of the device, chemically plating gold upon the N material in the presence of intense light forming a photovoltage maintaining the N material cathodic, whereby said gold plates all of the surface of said N-type material to and not including said junction, electroplating gold upon the P material by maintaining same electrically negative with respect to a gold anode in an electroplating bath, whereby the entire surface of P-type material is plated to and not including said junction, and alloying the gold plating into said surfaces at a temperature above the eutectic temperature of gold and transistor material to form ohmic contacts to said N and P-type materials of the device.

2. A method of transistor manufacture as claimed in claim 1 further defined by said diffusing comprising diffusing a P-type base material onto an N-type wafer and an N-type emitter material onto said P-type base, and said electroplating including the establishment of said electrical potential between said wafer and gold anode whereby an electrical path is provided through the P-type base for gold deposition upon the surface thereof.

3. A method of forming ohmic contacts upon adjacent emitter and base surfaces of a silicon junction transistor having a plurality of different zones of different polarity extending to a single face of the transistor with transistor junctions between said zones, comprising the steps of carrying out a displacement reaction between the transistor and a basic gold solution in the presence of intense light whereby the N-type silicon becomes cathodic and the gold preferentially plates same without covering the N-P junction, electroplating the P-type silicon by maintaining same negative with respect to a gold anode in a plating solution without covering the N-P junction, and alloying said plating to said separate silicon materials.

4. A method as claimed in claim 3 further characterized by limiting the time during which said displacement reaction is carried out in accordance with the impurity concentration in said silicon to terminate the reaction before plating of the P-type silicon occurs.

5. A method as claimed in claim 3 further defined by carrying out said displacement reaction in a basic solution of potassium gold cyanide and said electroplating in a gold cyanide bath.

6. A method of plating adjacent emitter and base surfaces of a double-diffused silicon transistor of the N-P-N junction type and having at least base and emitter zones extending to a single transistor surface and there separated by a transistor junction, comprising the steps of disposing a transistor in a basic solution of potassium gold cyanide with an intense light directed upon the emitter and base thereof whereby a photovoltaic effect maintains said N-type emitter material cathodic to preferentially receive the gold plating without covering said junction, and electroplating the P-type base material by immersion of same in a cyanide plating bath with a gold anode therein while maintaining the latter at a positive potential with respect to the transistor whereby said junction is not plated.

7. A method as claimed in claim 6 further defined by applying heat to said transistor in the potassium gold cyanide solution to hasten a displacement reaction therebetween, and limiting the duration of said reaction in accordance with the impurity concentration in said silicon to preclude gold deposition on the P-type material.

8. A method as set forth in claim 6 further defined by heating said plated transistor to a temperature in excess of the gold-silicon eutectic temperature of 373 degrees C. for alloying the gold and silicon to minimize discontinuities at the joinder thereof.

9. A process for gold plating adjacent emitter and base surfaces of a double-diffused N-P-N silicon transistor within minute separation from a junction therebetween at one face of the transistor comprising the steps of disposing a transistor in a basic solution of potassium gold cyanide, heating said solution, directing an intense light upon the adjacent emitter and base transistor surfaces whereby gold is preferentially chemically plated upon the N-type transistor emitter without plating said junction, disposing the transistor in part within an electrolytic cell containing a gold anode, insulating the transistor collector surface and juncture exposed to said bath, and connecting a power supply between said transistor collector and said gold anode to maintain the latter positive for preferentially electroplating the transistor base surface without plating said junction.

References Cited in the file of this patent

UNITED STATES PATENTS 2,694,040 Davis et al. ............ Nov. 9, 1954
2,814,589 Waltz ................ Nov. 26, 1957
2,823,175 Roschen .............. Feb. 11, 1958
2,873,303 Rittner .............. Feb. 10, 1959
2,893,929 Schnable ............. July 7, 1959

FOREIGN PATENTS 464,112 Great Britain .......... Apr. 12, 1937

OTHER REFERENCES

"Television," vol. 1, No. 1, June 1928, page 20, Experimental Publishing Company.